(12) United States Patent
Sugimoto et al.

(10) Patent No.: US 9,090,965 B2
(45) Date of Patent: Jul. 28, 2015

(54) SLIDE PART

(75) Inventors: Itto Sugimoto, Hitachi (JP); Kazutaka Okamoto, Tokai (JP); Fumiaki Honda, Matsue (JP); Kenichi Inoue, Yasugi (JP)

(73) Assignee: HITACHI METALS, LTD., Tokyo (JP)

( * ) Notice: Subject to any disclaimer, the term of this patent is extended or adjusted under 35 U.S.C. 154(b) by 111 days.

(21) Appl. No.: 12/872,106

(22) Filed: Aug. 31, 2010

(65) Prior Publication Data

US 2011/0052934 A1 Mar. 3, 2011

(30) Foreign Application Priority Data

Aug. 31, 2009 (JP) ................................ 2009-199201
May 31, 2010 (JP) ................................ 2010-123648

(51) Int. Cl.
 *B32B 9/00* (2006.01)
 *C23C 14/06* (2006.01)
 *C23C 14/00* (2006.01)
 *C23C 28/00* (2006.01)

(52) U.S. Cl.
 CPC ......... *C23C 14/0605* (2013.01); *C23C 14/0036* (2013.01); *C23C 14/0641* (2013.01); *C23C 28/32* (2013.01); *C23C 28/343* (2013.01); *C23C 28/36* (2013.01); *Y10T 74/19* (2015.01); *Y10T 428/12549* (2015.01); *Y10T 428/24975* (2015.01); *Y10T 428/25* (2015.01)

(58) Field of Classification Search
 None
 See application file for complete search history.

(56) References Cited

U.S. PATENT DOCUMENTS

| 5,776,615 | A * | 7/1998 | Wong et al. .................. 428/698 |
| 7,255,084 | B2 * | 8/2007 | Savale et al. ................ 123/193.6 |
| 7,458,585 | B2 | 12/2008 | Hamada et al. |
| 7,498,083 | B2 * | 3/2009 | Yamamoto et al. ........... 428/408 |
| 2007/0078067 | A1 * | 4/2007 | Nakagawa et al. ........... 508/363 |
| 2007/0116956 | A1 | 5/2007 | Chen |
| 2007/0254187 | A1 | 11/2007 | Yamamoto |
| 2007/0284255 | A1 * | 12/2007 | Gorokhovsky et al. ......... 205/89 |

FOREIGN PATENT DOCUMENTS

| JP | 2000-192183 | 7/2000 |
| JP | 2001-316686 | 11/2001 |
| JP | 2005-060416 | 3/2005 |
| JP | 2006-002221 | 1/2006 |

(Continued)

OTHER PUBLICATIONS

Martinez- Martinez, Self-Lubricating Ti—C—N nanocomposite Coatings Prepared by Double Magnetron Sputtering, Solid States Sciences, vol. 11, No. 3, Mar. 1, 209 pp. 660-670.

(Continued)

*Primary Examiner* — Mark Ruthkosky
*Assistant Examiner* — Daniel J Schleis
(74) *Attorney, Agent, or Firm* — Baker & Botts L.L.P.

(57) ABSTRACT

There is provided a slide part used in an environment where there is a lubricant containing a molybdenum compound including a hard protective layer formed on an outermost surface of a substrate of the slide part; in which: the hard protective layer includes mainly carbon, nitrogen, and a metal element; the hard protective layer is composed of a complex of an amorphous carbon body containing nitrogen and a compound crystal of the metal element; the compound crystal is composed of at least one of a metal carbide, a metal nitride, and a metal carbonitride; and a surface hardness of the hard protective layer is 1800 or larger in Vickers hardness.

20 Claims, 9 Drawing Sheets

(56) References Cited

FOREIGN PATENT DOCUMENTS

| JP | 2006-117997 | 5/2006 |
|---|---|---|
| JP | 2006-144070 | 6/2006 |
| JP | 2007-23356 | 2/2007 |
| JP | 2007-291484 | 11/2007 |
| JP | 2008-195903 | 8/2008 |
| WO | WO 03/029685 | 4/2003 |

OTHER PUBLICATIONS

Voevodin et al., Architecture of Multilayer Nanocoposite Coatings with Super-hard Diamond-like Carbon Layers for Wear Protection at high Contact Loads, Wear 1997 Mar Elsevier Science , vol. 203-204, Mar. 1997, pp. 516-527.

Voevodin et al., Recent Advantages in Hard, Tough, and Low Friction Nanocomposite Coatings Tsinghua Science and Technology, Tsinghua University Press, Vo. 10, No. 6, Dec. 1, 2005, pp. 665-679.

EP Search Report of Appln. 10174644.4 dated Dec. 17, 2010 in English.

JP Search of Appln. No. 2009-199201 dated Nov. 15, 2011 with English translation.

"Friction, Wear and $N_2$—Lubrication of Carbon Nitride Coatings: A Review", by Koji Kato, Noritsugu Umehara, and Koshi Adachi, published in Wear, vol. 254 (2003), pp. 1062-1069.

"Wear Analysis of DLC Coating in Oil Containing Mo-DTC" by T. Shinyoshi, y. Fuwa, and Yoshinori Ozaki, published in SAE 2007 Transaction Journal of Fuels and Lubricants, vol. 116, paper No. 2007-01-1969.

"Tribological Behaviors of Diamond-Like Carbon Coatings on Plasma Nitrided Steel Using Three BN-Containing Lubricants", by Z. Jia, P. Wang, Y. Xia, H. Zhang, X. Pang, and B. Li, published in Applied Surface Science, vol. 255 (2009), pp. 6666-6674.

\* cited by examiner

EXAMPLE 1

SLIDE PART

CLAIM OF PRIORITY

The present application claims priority from Japanese patent applications: serial no. 2009-199201 filed on Aug. 31, 2009; and serial no. 2010-123648 filed on May 31, 2010, the contents of which are hereby incorporated by reference into this application.

BACKGROUND OF THE INVENTION

1. Field of the Invention

The present invention relates to a slide part used in a lubricated environment, and more particularly, to a slide part with an amorphous carbon coating formed on its sliding surface.

2. Description of the Related Art

Slide parts with amorphous carbon coatings formed on their sliding surfaces have been under intense research and development in order primarily to lower friction at sliding points particularly of automobile parts. Thin film materials referred to as DLC (diamond-like carbon), i-C (i-carbon), hard carbon, etc. are commonly used for amorphous carbon coatings.

Since amorphous carbon coatings are amorphous structures with no grain boundaries (no clear crystal structures), they have features of high hardness, high toughness, and low frictional properties at the same time. In this viewpoint, amorphous carbon coatings are regarded as superior to crystalline hard coatings, such as TiN (titanium nitride) and CrN (chromium nitride), in durability against mechanical wear. Therefore, slide parts with amorphous carbon coatings formed on their surfaces are expected to contribute to improving the fuel economy and extending the life of parts.

In general, amorphous carbon coatings are hard coatings composed of carbon atoms and hydrogen atoms. However, amorphous carbon coatings containing a ternary element have been proposed. For example, JP 2007-023356 A discloses a sliding layer of amorphous carbon containing more than 30 atomic percent (at. %) to less than 50 at. % of hydrogen and 1.5 at. % or more to 20 at. % or less of silicon. According to JP 2007-023356 A, the self-smoothing properties of the sliding layer and silanol formed on the sliding surface can lower the friction of slide parts.

WO 03/029685 A1 discloses an amorphous hard carbon coating containing at least one of silicon and nitrogen in an amount ranging from 1 to 50 at. %. According to WO 03/029685 A1, a high frictional slider which exhibits a stably high friction coefficient, favorable velocity dependent properties and a high wear resistance, and causes less damage to mating materials under wet sliding conditions where a drivetrain lubricant is used can be obtained.

JP 2005-060416 A discloses a low frictional slider composed of members with sliding surfaces formed of DLC materials. The DLC materials of at least one of the members are composed of an amorphous carbon (a-C) material containing no hydrogen. The sliding surface between the members is lubricated with a lubricant composition containing a fatty acid ester ashless friction modifier and/or an alifatic amine ashless friction modifier. According to JP 2005-060416 A, the low frictional slider exhibits low friction properties and wear resistance superior to those of conventional slide parts composed of aluminum alloys and steel materials in combination with organomolybdenum compounds.

JP 2001-316686 A discloses a slider obtained by forming a hard carbon coating containing at least one metal element selected from among group IIb, III, IV, Va, VIIa, VIIa, and VIII elements in the periodic table on at least the surface layer of a substrate for use in a lubricant in an amount ranging from 5 to 70 at. %. According to JP 2001-316686 A, in a lubricated environment where there is a lubricant containing Mo-DTC (molybdenum dialkyldithiocarbamate) and Zn-DTP (zinc dithiophosphate), a lubricant additive coating is easily formed on the surface of the hard carbon coating, and the slider exhibits superior low frictional properties.

JP 2006-002221 A discloses a slide part with the outermost surface of its slide member coated with a chromium- and carbon-based diamond-like carbon coating containing 5 to 16 at. % of chromium. According to JP 2006-002221 A, the chromium-containing diamond-like carbon coating exhibits low frictional properties and favorable sliding properties even under unlubricated or less lubricated conditions.

JP 2008-195903 A discloses a sliding structure used in a lubricated environment where there is an organomolybdenum compound such as Mo-DTC even in a small amount. In the sliding structure, an amorphous carbon coating containing a hydrogen element is formed on the sliding surface of at least one of a pair of sliding members, and the amorphous carbon coating contains an element to inhibit the production of molybdenum trioxide by the organomolybdenum compound. More specifically, the amorphous carbon coating containing as the inhibiting element at least one element selected from among sulfur, magnesium, titanium, and calcium, for example, is formed so that the inhibiting element is provided into a lubricant via friction particles generated during sliding operations.

Kato et al. report a study on amorphous carbon nitride coatings ($CN_x$-coatings) composed of carbon and nitrogen in Academic Document 1 entitled "Friction, Wear and $N_2$-Lubrication of Carbon Nitride Coatings: a Review" by Koji Kato, Noritsugu Umehara, and Koshi Adachi, published in Wear vol. 254 (2003), pages 1062-1069. According to Kato et al., friction coefficients between silicon nitride ($Si_3N_4$) balls and $CN_x$-coatings vary considerably depending on the kind of atmosphere gas, and they decrease significantly only in the nitrogen gas atmosphere.

Shinyoshi et al. and Jia et al. report studies on wear in amorphous carbon coatings in a lubricant containing Mo-DTC (molybdenum dialkyldithiocarbamate) in Academic Document 2 entitled "Wear Analysis of DLC Coating in Oil Containing Mo-DTC" by T. Shinyoshi, Y. Fuwa, and Yoshinori Ozaki, published in SAE 2007 Transaction Journal of Fuels and Lubricants vol. 116, paper number 2007-01-1969, and Academic Document 3 entitled "Tribological behaviors of diamond-like carbon coatings on plasma nitrided steel using three BN-containing lubricants" by Z. Jia, P. Wang, Y. Xia, H. Zhang, X. Pang, and B. Li, published in Applied Surface Science vol. 255 (2009), pages 6666-6674, respectively. According to these Academic Documents, Mo-DTC in a lubricant is thermally decomposed to produce molybdenum disulfide and molybdenum oxides, and molybdenum trioxide, in particular, is deeply involved in wear in amorphous carbon coatings. However, the views on the wear mechanism are different between the Academic Documents. Shinyoshi et al. maintain that amorphous carbon coatings wear by changing to carbon oxide gas due to redox reactions between molybdenum trioxide and amorphous carbon coatings. Meanwhile, Jia et al. claim that amorphous carbon coatings mechanically wear due to hard and sharp molybdenum trioxide.

In general, amorphous carbon coatings are known to have high hardness, low friction properties, and high wear resistance. Unfortunately, however, as reported in the above Academic Documents 2 and 3 and JP 2008-195903 A, amorphous carbon coatings can wear away significantly in a sliding environment where there is a lubricant containing molybdenum compounds including Mo-DTC (molybdenum dialkyldithiocarbamate) and Mo-DTP (molybdenum dithiophosphate), which are known as friction modifiers. At this stage, as can be inferred from the difference in views between Academic Documents 2 and 3, the wear mechanism has not yet been established in academic society.

On the other hand, it is an extremely important challenge to further improve friction properties and wear resistance of slide parts as typified by automobile parts in order to meet the growing needs for environmental protection and energy conservation. Although the invention described in JP 2008-195903 A attempts to solve problems assuming a wear mechanism similar to that described in Academic Document 2, its advantage has not proven fully sufficient in confirmatory experiments conducted by the inventors. This can be attributed to the fact that the wear mechanism has not been fully understood, among other things. In other words, it is crucial to shed light on the wear mechanism in order to solve the challenge.

SUMMARY OF THE INVENTION

In view of the foregoing, it is an objective of the present invention to provide a slide part with low frictional properties and a high wear resistance superior to those of the prior art in a sliding environment where there is a lubricant containing a friction modifier by clarifying the wear mechanism of amorphous carbon coatings to solve the challenge discussed above.

The inventors have clarified the wear mechanism of amorphous carbon coatings by conducting sliding tests systematically in an environment where there is a lubricant containing a molybdenum compound as a friction modifier, by examining test specimens and lubricants after the sliding tests, and by performing various thermal and structural analyses. The present invention has been completed based on the important and novel findings from these.

(I) In accordance with an aspect of the present invention, there is provided a slide part used in an environment where there is a lubricant containing a molybdenum compound including a hard protective layer formed on an outermost surface of a substrate of the slide part; in which: the hard protective layer includes mainly carbon, nitrogen, and a metal element; the hard protective layer is composed of a complex of an amorphous carbon body containing nitrogen and a compound crystal of the metal element; the compound crystal is composed of at least one of a metal carbide, a metal nitride, and a metal carbonitride; and a surface hardness of the hard protective layer is 1800 or larger in Vickers hardness.

(II) In accordance with another aspect of the present invention, there is provided a hard protective layer formed on an outermost surface of a substrate of the slide part, in which: the hard protective layer includes mainly carbon, nitrogen, and a metal element; the hard protective layer is composed of a complex of an amorphous carbon body containing nitrogen and a compound crystal of the metal element; the compound crystal is composed of at least one of a metal carbide, a metal nitride, and a metal carbonitride; a surface hardness of the hard protective layer is 1800 or larger in Vickers hardness; and a thickness of the hard protective layer is 0.5 to 8 µm.

In the above aspects (I) and (II) of the present invention, the following improvements and changes can be made.

(i) When an entirety of carbon (C), nitrogen (N), and the metal element is taken as 100 at. %, the hard protective layer contains 59 at. % or more of carbon, 0.1 at. % or more to 35 at. % or less of nitrogen, and 0.05 at. % or more to 38 at. % or less of the metal element, while a combined amount of nitrogen and the metal element is 5 at. % or more.

(ii) The hard protective layer further contains 25 at. % or less of hydrogen (H), 18 at. % or less of oxygen (O), and 5 at. % or less of argon (Ar).

(iii) The metal element is at least one of chromium (Cr), titanium (Ti), and tungsten (W).

(iv) The complex is composed of the compound crystal which is 0.1 nm or larger to 100 nm or smaller (more preferably, 0.1 nm or larger to 50 nm or smaller) in particle size dispersed in a matrix of the amorphous carbon body; the hard protective layer contains 0.08 volume percent (vol. %) or more to 76 vol. % or less of the compound crystal; and a number density of the compound crystal is 1 particle/$10^6$ µm$^3$ or more to $10^{12}$ particles/µm$^3$ or less.

(v) The complex is composed of layers of the amorphous carbon body and layers of the compound crystal alternately laminated; the hard protective layer contains 30 vol. % or more to 76 vol. % or less of the compound crystal; the layers of the compound crystal are 1 nm or more to 50 nm or less in thickness; and the layers of the amorphous carbon body are 0.3 nm or more to 117 nm or less (more preferably, 0.3 nm or more to 100 nm of less) in thickness.

(vi) A plurality of interlayers are sandwiched between the hard protective layer and the substrate; and the plurality of interlayers are composed of a first interlayer formed of the metal element immediately on the substrate, a second interlayer formed of the metal element and the metal carbide immediately on the first interlayer, and a third interlayer formed of the metal carbide and the amorphous carbon body immediately on the second interlayer.

(vii) The slide part is either a valve lifter, an adjusting shim, a cam, a camshaft, a rocker arm, a tappet, a piston, a piston pin, a piston ring, a timing gear, or a timing chain which are disposed in an internal combustion engine, or a drive gear, a driven gear, a rotor, a vane, or a cam which are disposed in an oil pump.

(viii) The slide part is used in an environment where there is an engine oil containing a molybdenum compound; and the molybdenum compound is molybdenum dialkyldithiocarbamate (Mo-DTC) and/or molybdenum dithiophosphate (Mo-DTP).

(III) Furthermore, in accordance with still another aspect of the present invention, there is provided a method for manufacturing a slide part used in an environment where there is a lubricant containing a molybdenum compound comprising a hard protective layer formed on an outermost surface of the slide part, the hard protective layer including mainly carbon, nitrogen, and a metal element, the hard protective layer composed of a complex of an amorphous carbon body containing nitrogen and a compound crystal of the metal element, the compound crystal composed of at least one of a metal carbide, a metal nitride, and a metal carbonitride, and the surface hardness of the hard protective layer being 1800 or larger in Vickers hardness. In addition, the hard protective layer is formed by a reactive sputtering method using a non-equilibrium magnetron sputtering device; a graphite target and a target containing at least one metal element selected from among chromium, titanium, and tungsten are used; and hydrocarbon gas and nitrogen gas are used as a reactive gas.

Advantages of the Invention

The present invention can provide a slide part with low frictional properties and a high wear resistance superior to those of the prior art in a sliding environment where there is a lubricant containing a friction modifier.

DETAILED DESCRIPTION OF THE PREFERRED EMBODIMENTS

Clarification of Wear Mechanism

Figure 1:
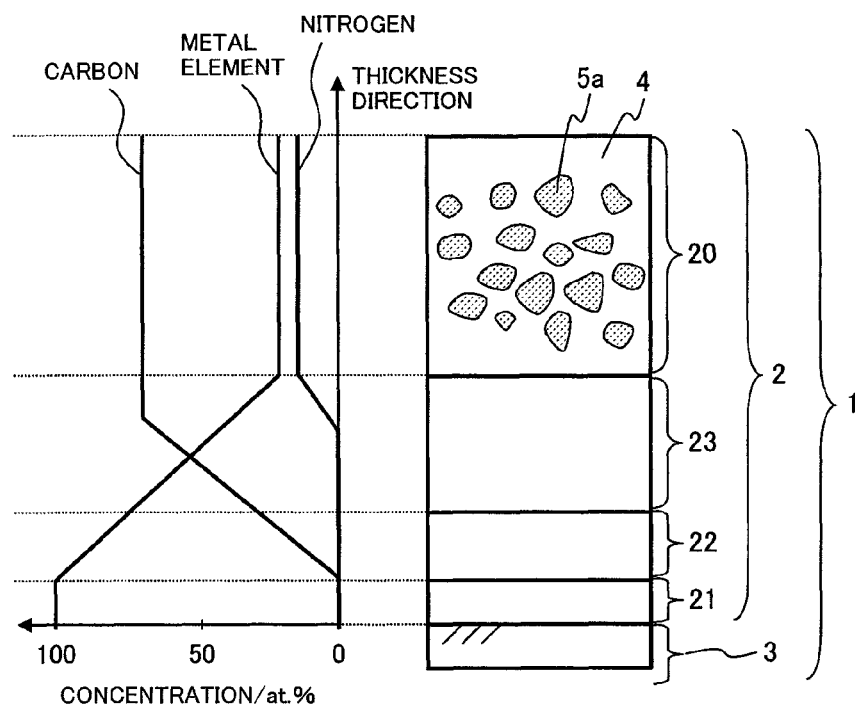
FIG. 1 is a schematic illustration showing a cross-sectional view of an example of a slide part in accordance with an embodiment of the present invention and an image of composition distribution at the cross-section surface.

As mentioned above, the inventors have clarified the wear mechanism of amorphous carbon coatings by conducting sliding tests systematically in an environment where there is a lubricant (more specifically, an engine oil) containing a molybdenum compound (more specifically, Mo-DTC) as a friction modifier, examining test specimens and lubricants after sliding tests, and performing various thermal and structural analyses. The tests and examinations are described hereinafter.

Conventionally, the following has been suggested as part of the wear mechanism of amorphous carbon coatings:
(1) weakening of coating surfaces due to frictional heat;
(2) weakening of coating surfaces due to chemical reactions;
(3) mechanical wear at weak spots due to sliding; and
(4) mechanical wear at weak spots due to hard inclusions.

Academic Document 2 reports (1) and (3), and Academic Document 3 reports (1) and (4). Meanwhile, amorphous carbon coatings are known to exhibit high wear resistances in a sliding environment where (2) and (4) do not occur (for example, in a sliding environment where there is a lubricant containing no molybdenum compound as a friction modifier, or in a sliding environment where no lubricant is used), since there is no factor which contributes to wear chemically or mechanically.

First, the inventors conducted tests and examinations on the weakening of coating surfaces due to frictional heat. It is known that when heat-treated at 350° C. or higher, an amorphous carbon coating (e.g., a DLC coating) changes in structure to take on a microstructure, which is thermodynamically more stable but mechanically weaker. It is also known that the structural change increases D-Peak intensity in the Raman scattering spectrum. In fact, the results of microstructural observation by transmission electron microscopy and analysis by Raman scattering spectroscopy conducted on a heat-treated DLC coating demonstrated that the bond type between carbon atoms changed from the diamond-like sp3 to the graphite-like sp2, and the carbon atoms formed graphite clusters which were 0.1 to 100 nm in particle size.

There is concern that frictional heat generated during sliding operations can weaken the surfaces of amorphous carbon coatings. Therefore, the inventors conducted a sliding test using an engine oil containing no Mo-DTC. The results of detailed examination of the engine oil collected after the sliding test demonstrated that abrasion powder of the amorphous carbon coating (small in absolute amount) was not the coating component itself before the test (DLC), but a carbon solid with a graphite-like structure. This indicates that (1) and (3) of the wear mechanism mentioned above at least exist.

Next, the inventors conducted tests and examinations to find out the influence of Mo-DTC that is commonly added as a friction modifier. It is known that a chemically active and hard molybdenum compound is produced during sliding operations where an engine oil containing Mo-DTC is used. In fact, molybdenum sulfide and molybdenum oxide, which are sliding products, were found in the engine oils and test specimens collected after sliding tests using engine oils containing Mo-DTC.

In order to find out the influence of molybdenum sulfide and molybdenum oxide, the inventors carried out the following additional tests. First, the inventors formed an amorphous carbon coating containing aluminum (Al), which is more reactive with oxygen than carbon and less capable of forming a carbide, and conducted a sliding test using the engine oil containing Mo-DTC. This was because the inventors believed that if (2) of the wear mechanism mentioned above (here, weakening of a coating surface due to a redox reaction with a molybdenum compound) had a strong influence, aluminum in the amorphous carbon coating would cause a sacrificial oxidation reaction, inhibiting wear in the amorphous carbon coating. However, the results demonstrated that the wear in the Al-added amorphous carbon coating was significant enough, and there was no noticeable wear-inhibiting effect due to a sacrificial oxidation reaction of Al.

Next, the inventors mixed alumina particles, which are chemically highly stable and hard, into an engine oil containing no Mo-DTC, and conducted a sliding test using the engine oil. This test was to verify (4) of the wear mechanism mentioned above (i.e., a wear promoting effect of hard inclusions), and the inventors believed that the use of chemically stable alumina particles would make it possible to observe wear in an amorphous carbon coating which was not caused by a chemical reaction (here, a redox reaction). The results demonstrated that the wear in the amorphous carbon coating was much more significant than in the sliding test using the oil containing no hard particles, but less significant than in the sliding test using the oil containing Mo-DTC. Also, examination on abrasion powder of the amorphous carbon coating discharged into the oil demonstrated that it was a carbon solid with a graphite-like structure.

The results described above suggest that the influence of hard inclusions reported in Academic Document 3 is stronger than that of a redox reaction reported in Academic Document 2. Also, because a less hard molybdenum compound caused more wear than hard alumina particles, a redox reaction is considered to have no small effect of promoting wear. Furthermore, because the abrasion powder had a graphite-like structure, the structural change from a diamond-like structure to a graphite-like structure is considered to be the beginning of wear. Overall findings obtained from these tests and examinations indicate that the wear mechanism of amorphous carbon coatings is "chemical mechanical wear" which is a combination of (1) to (4) mentioned above.

In lubricated sliding environments, such as those in which automobile parts are used, there is much need for hard coatings with durability against the chemical mechanical wear described above (wear resistance) as well as low frictional properties, high hardness properties, and high toughness in a lubricant, and for slide parts on which such hard coatings are formed, in order to further improve fuel-efficient properties and extend the life of parts.

Here, the friction-reducing effect of molybdenum compounds at sliding points between metals is remarkable, and at present, they are actively used as friction modifiers added in many kinds of lubricants. Under these circumstances, it is not practical to use lubricants containing no friction modifiers only to inhibit wear in amorphous carbon coatings. In other words, an essential approach must be taken to amorphous carbon coatings based on an understanding of the above mentioned wear mechanism. The inventors focused on the fact that the structural change in amorphous carbon coatings (the bond type between carbon atoms) from a diamond-like structure to a graphite-like structure is the initial stage of wear process, and regarded stabilizing the structure of amorphous carbon coatings as the starting point of the present invention.

Preferred embodiments of the present invention are described hereinafter with reference to the accompanying drawings. However, the present invention is not limited to the specific embodiments described below, but various combinations and modifications can be made accordingly without departing from the scope of the invention.

[Composition of Hard Coatings]

A hard protective layer according to the present invention comprises mainly amorphous carbon, which intrinsically has a high hardness and a high toughness, and is a complex with a microstructure that can inhibit weakening of the amorphous carbon. As a result, it exhibits superior durability against the above mentioned chemical mechanical wear. At the same time, the hard protective layer of the present invention exhibits superior low frictional properties in a lubricant containing additives including oil additives, extreme-pressure additives, and friction reducers, as it contains a metal element in a moderate amount, which promotes interaction with those additives.

The structural change of an amorphous carbon coating due to frictional heat can be attributed to change in the bond type between carbon atoms. Therefore, substituting nitrogen atoms for part of the carbon atoms can inhibit structural change. Also, a compound crystal comprised a metal carbide, a metal nitride, and a metal carbonitride which is formed in the amorphous carbon body has thermochemical stability superior to that of the amorphous carbon body, and thus can contribute to improving heat resistance of the complex (a hard protective layer) as a whole. A metal nitride, in particular, is thermochemically stable, and is highly effective in this regard. All these factors can together contribute to inhibiting chemical mechanical wear in the hard protective layer. In addition, controlling the amounts of nitrogen and the metal element contained in the hard protective layer can ensure that the hard protective layer is 1800 or larger in Vickers hardness.

There is no particular limit to the thickness of the hard protective layer and the thickness may be set according to the intended purpose of a slide part (i.e., the environment in which the part is used). However, the hard protective layer must be thick enough to uniformly cover a sliding surface. Meanwhile, if a hard protective layer is too thick, cracking and debonding can occur due to internal stress caused by the difference in physical properties between the layer and a substrate. A preferred thickness would be 0.5 to 8 μm.

Although addition of nitrogen is the most effective in inhibiting chemical and mechanical wear in the amorphous carbon coating, adding more than 35 at. % of nitrogen decreases the hardness of the amorphous carbon. Meanwhile, adding less than 0.1 at. % of nitrogen is not effective enough. Moreover, adding only nitrogen decreases the hardness of the amorphous carbon coating, increasing the potential for mechanical wear. Also, it is prone to increase the friction coefficient in a lubricant.

On the other hand, adding more than 38 at. % of the metal element impairs high toughness characteristic of the amorphous carbon coating. Also, adding less than 0.05 at. % of the metal element produces too small an amount of a compound crystal to bring about the above mentioned advantage. It is preferred that at least one of chromium, titanium and tungsten, which produce a hard carbide, a hard nitride, a hard carbonitride, is used. In addition, adding only the metal element is not very effective in inhibiting the structural change of the amorphous carbon coating. Therefore, its effect of inhibiting chemical mechanical wear is insufficient, which is prone to be a factor in impairing toughness.

It is preferred that when the entirety of carbon, nitrogen, and a metal element is taken as 100 at. %, an amorphous carbon coating (a hard protective layer) contains 59 at. % or more of carbon, 0.1 at. % or more to 35 at. % or less of nitrogen, and 0.05 at. % or more to 38 at. % or less of the metal element, while the combined amount of nitrogen and the metal element is 5 at. % or more. Controlling the composition amounts within these ranges makes it possible to form a preferred microstructure and obtain the hard protective layer with a surface hardness of 1800 or larger in Vickers hardness. If the hardness of the hard protective layer is less than this value, the deformation amount of a substrate is likely to increase during sliding operations, contributing to interfacial debonding.

As is the case with the amorphous carbon coating in accordance with the present invention, the amorphous carbon coating (the hard protective layer) containing nitrogen and the metal element exhibits low frictional properties, high hardness properties, high toughness, and inhibitive power against chemical mechanical wear in a lubricant at the same time due to substitution of nitrogen, production of a metal carbide crystal, and production of a metal nitride and a metal carbonitride, which are more thermochemically stable. Furthermore, the metal element in the hard protective layer can obtain superior low frictional properties by interaction with a molybdenum compound in a lubricant.

Figure 11:
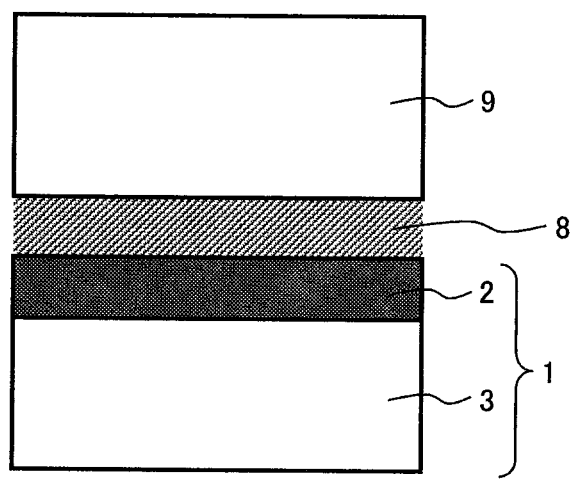
FIG. 11 is a schematic illustration showing a sliding environment of a slide part in accordance with an embodiment of the present invention.

FIG. 11 is a schematic illustration showing a sliding environment of a slide part in accordance with an embodiment of the present invention. As shown in FIG. 11, a slide part 1 in accordance with the present invention has a hard coating 2 formed on the sliding surface of a substrate 3. The slide part 1 slides on a mating member 9 via a lubricant 8 containing a molybdenum compound. Preferred materials for the substrate 3 include, but are not limited to, a steel material.

FIG. 1 is a schematic illustration showing a cross-sectional view of an example of a slide part in accordance with an embodiment of the present invention and an image of composition distribution at the cross-section surface. As shown in FIG. 1, a hard protective layer 20, which is the outermost surface of the hard coating 2, is a complex including compound crystal particles 5a composed of at least one of a metal carbide, a metal nitride, and a metal carbonitride finely dispersed in the matrix of an amorphous carbon body 4 containing nitrogen. The hard coating 2 may be a single-layer coating of the hard protective layer 20. However, the hard coating 2 with a multi-layer structure comprising compositionally gradient interlayers 21 to 23 in addition to the hard protective layer 20 exhibits further superior properties (Details are described hereinafter).

It is preferred that the particle size of the compound crystal particles 5a dispersed is as small as possible in order for the amorphous carbon body 4 to maintain its intrinsic high toughness. In a strengthening mechanism similar to that of the Hall-Petch equation known in the study of metallic crystals, the smaller the particle size is, the higher toughness becomes. Moreover, from the viewpoint of inhibiting the change/growth of the amorphous carbon body 4 from a cluster with a diamond-like structure to a cluster with a graphite-like structure, which is the initial stage of weakening process, the compound crystal particles 5a are preferably 0.1 to 100 nm in size, that is similar to the size of a graphite cluster, and more preferably, 0.1 to 50 nm in size.

The volume fraction and the number density of the compound crystal particles 5a finely dispersed in the hard protective layer 20 are preferably 0.08 to 76 vol. % and 1 particle/$10^6$ $\mu m^3$ or more to $10^{12}$ particles/$\mu m^3$ or less, respectively. The larger the volume fraction of the compound crystal than the preferred value is, the lower the toughness of the hard protective layer 20 becomes. In the present invention, it is possible to reduce the size of the compound crystal particles 5a formed in the hard protective layer 20 down to the nanoscale level. By controlling the size of the compound crystal particles 5a within the range of 0.1 to 100 nm within the above mentioned composition range, the volume fraction and the number density can be controlled within the preferred ranges. In addition, these microstructures can be analyzed by area analysis methods including cross-sectional observation by transmission electron microscopy, X-ray diffractometry, and X-ray photoelectron spectroscopy.

As mentioned above, it is preferred that the hard coating 2 has a multi-layer structure comprising interlayers 21 to 23 between the hard protective layer 20 and the substrate 3. In this case, it is preferred that the first interlayer 21 is formed of only metal immediately on the substrate 3, the second interlayer 22 is formed of metal and a metal carbide immediately on the first interlayer 21, the third interlayer 23 is formed of a metal carbide and amorphous carbon immediately on the second interlayer 22, and the composition profiles of the interlayers 21 to 23 continuously vary from the interface with the substrate 3 to the interface with the hard protective layer 20 in the thickness direction (see FIG. 1). In other words, the compositional difference between the interlayers becomes smaller from bottom to top. This multilayer structure relaxes internal stress of the hard coating 2, and it increases the adhesion to the substrate 3, inhibiting interfacial debonding and further improving durability.

Figure 2:
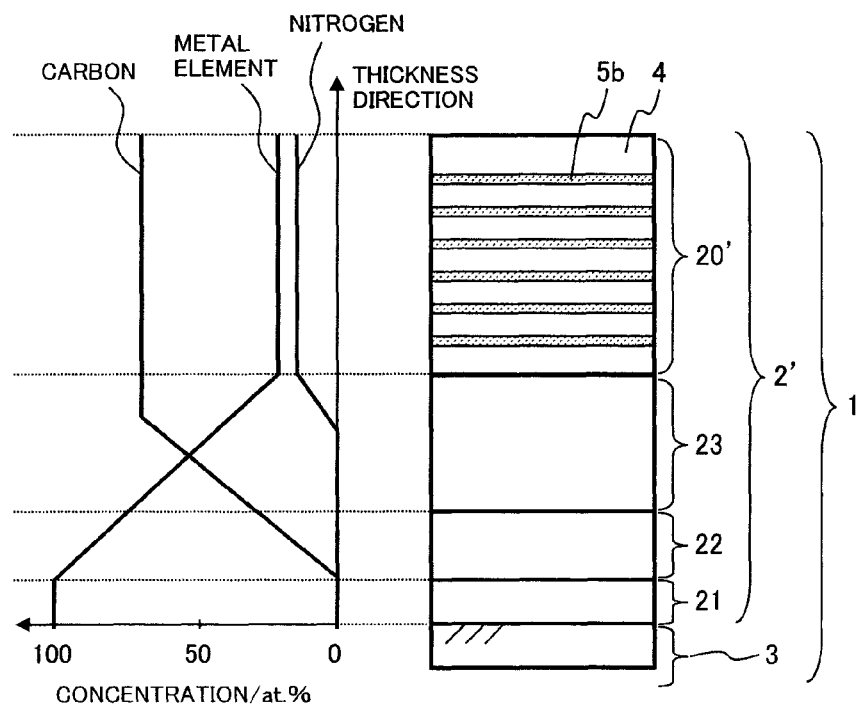
FIG. 2 is a schematic illustration showing a cross-sectional view of another example of a slide part in accordance with an embodiment of the present invention and an image of composition distribution at the cross-section surface.

FIG. 2 is a schematic illustration showing a cross-sectional view of another example of a slide part in accordance with an embodiment of the present invention and an image of composition distribution at the cross-section surface. As shown in FIG. 2, a hard protective layer 20', which is the outermost surface of a hard coating 2', is a complex including layers of the amorphous carbon body 4 and compound crystal layers 5b composed of at least one of the metal carbide, the metal nitride, and the metal carbonitride alternately laminated. The hard coating 2' may be a single-layer coating of the hard protective layer 20'. However, similarly to the above mentioned, the hard coating 2' with a multi-layer structure comprising compositionally gradient interlayers 21 to 23 in addition to the hard protective layer 20' exhibits further superior properties.

The volume fraction and the thickness of the compound crystal layers 5b are preferably 30 to 76 vol. % and 1 to 50 nm, respectively. Also, the spacing between the compound crystal layers 5b (the thickness of a layer of amorphous carbon body 4) is preferably 0.3 to 117 nm, and more preferably, 0.3 to 100 nm. If the volume fraction of the compound crystal layers 5b is less than 30 vol. %, it is more difficult to form a laminar microstructure. The thinner the compound crystal layers 5b are, the more flexible to deformation they become, thus inhibiting interfacial debonding. Meanwhile, if the thickness of the compound crystal layer 5b is less than 50 nm, which is less than $\frac{1}{10}$ of that of the hard protective layer 20', the compound crystal layers 5b can fulfill their function. In addition, similarly to the above mentioned, these microstructures can be analyzed by area analysis methods including cross-sectional observation by transmission electron microscopy, X-ray diffractometry, and X-ray photoelectron spectroscopy.

As described above, the hard protective layer containing the compound crystal either in the form of a microparticle or a layer has excellent properties. The hard protective layer containing the compound crystal in the form of a microparticle exhibits excellent durability against chemical mechanical wear, because it has both the amorphous carbon body and the compound crystal on its outermost surface. Meanwhile, the hard protective layer containing the compound crystal in the form of a layer exhibits the same advantage as in the form of a microparticle, since each layer, the amorphous carbon layer and the compound crystal layer, is thin enough and these layers are alternately laminated. Also, when the hard protective layer is locally worn, both the amorphous carbon body and the compound crystal exist on its outermost surface. Although amorphous carbon layers and compound crystal layers are drawn in parallel to the outermost surface in FIG. 2, they may be formed obliquely to the outermost surface. In the latter case, both the amorphous carbon body and the compound crystal exist on the outermost surface of the hard protective layer even if the hard protective layer is not worn at all.

Usually, various additives are added to lubricants. For example, oil additives including fatty acid, alcohol, and ester, extreme-pressure additives including sulfur additives and phosphorous additives, friction reducing additives including molybdenum dialkyldithiocarbamate (Mo-DTC), and composite additives including zinc dithiophosphate (Zn-DTP) are widely used as effective additives to reduce friction and wear. Conventionally, reducing friction by activating these additives has been considered.

In particular, friction reducing additives as typified by Mo-DTC and Mo-DTP are molybdenum compounds which produce $MoS_2$ and $MoO_3$, etc. due to friction heat generated during sliding operations. It is known that $MoS_2$ and $MoO_2$, etc. can reduce friction at a sliding surface. It is also known that this production reaction is affected by slide part materials and promoted if metal elements of the groups IVa, Va, and VIa, among others, are present. Unfortunately, however, $MoS_2$ and $MoO_3$, etc. thus produced to reduce friction promote wear in conventional hard coatings (amorphous carbon coatings).

In contrast, the hard protective layer in accordance with the present invention, provided with the above mentioned microstructures, has high durability (wear resistance) against chemical mechanical wear due to $MoS_2$ and $MoO_3$, etc. Moreover, because the hard protective layer in accordance with the present invention contains at least one metal element selected from among chromium, titanium, and tungsten in a sufficient amount, $MoS_2$ and $MoO_3$, etc. are produced more efficiently, which contributes to further superior low frictional properties. In addition, although either of the above mentioned metal elements can contribute to superior low frictional properties, chromium, which is homologous to molybdenum, is more absorptive of molybdenum compounds and therefore is especially effective in reducing friction.

On the other hand, in a sliding environment where surface pressure is extremely high, or where the amount of a lubricant is insufficient, it is preferred that the amount of the metal element contained in the hard protective layer is controlled to about half the preferred maximum value (e.g., 0.05 to 17 at. %). Also, if low frictional properties have a priority, it is preferred that the hard protective layer contains the metal element which contributes to molybdenum compound production in a sufficient amount and nitrogen in a less amount (e.g., 0.1 to 2 at. %).

The slide part in accordance with the present invention is suitable as a slide part for vehicles, for example, especially in a sliding environment where there is a lubricant containing a molybdenum compound. Possible uses include, but are not limited to, a valve lifter, an adjusting shim, a cam, a camshaft, a rocker arm, a tappet, a piston, a piston pin, a piston ring, a timing gear, or a timing chain which are disposed in an internal combustion engine, and a drive gear, a driven gear, a rotor, a vane, or a cam which are disposed in an oil pump.

[Manufacturing Method]

Although existing methods including a sputtering method, a plasma CVD method, and an ion plating method can be used to manufacture the hard coating in accordance with the present invention, a reactive sputtering method is particularly preferred to manufacture the hard protective layer. By the reactive sputtering method, coatings with smooth surfaces can be formed, and hard coatings containing metal elements, nitrogen, and carbon can be easily formed. In doing so, harder coatings can be formed by using hydrocarbon gas in order to supply non-easily ionizable carbon.

In employing the reactive sputtering method, it is preferred that a non-equilibrium magnetron sputtering device is used. With a conventional sputtering device, plasma is excited mainly close to a target, and it is difficult to keep plasma highly excited close to a substrate on which a coating is formed. In contrast, by the reactive sputtering method using a non-equilibrium magnetron sputtering device, plasma density can be increased closer to a substrate.

A graphite target and a target containing at least one metal element selected from among chromium, titanium, and tungsten are used, and hydrocarbon gas and nitrogen are used as a reactive gas. Also, argon gas is used to control plasma. Nitrogen is excited close to a target to form nitrogen plasma, and the nitrogen plasma is delivered to a substrate, still highly excited. At the same time, ionized carbon and atoms excited from each target are delivered to a substrate with their high excitation states maintained. As a result, nitrogen components can be efficiently taken into the amorphous carbon coating, while the metal carbide, the metal nitride, and the metal carbonitride are efficiently produced.

The hard protective layer formed by the above mentioned method inevitably contains hydrogen and argon. In such a case, it is preferred that the amount of hydrogen is controlled to 25 at. % or less and the amount of argon is controlled to 5 at. % or less. A hard protective layer containing hydrogen and argon in amounts more than these preferred values is weak. Also, if the hard protective layer thus formed is exposed to the air, oxygen can enter the layer due to surface oxidation, etc. In such a case, it is preferred that the amount of oxygen is controlled to 18 at. % or less. Controlling the amount of oxygen at the outermost surface of the hard protective layer within this range can control the amount of oxygen at a position about 0.1 μm deep from the surface to 2 at. % or less. Such an amount of oxygen does not adversely affect the properties of the hard protective layer. Here, the entirety of carbon, nitrogen, and the metal element is taken as 100 at. %, as mentioned before.

With the sputtering method, in general, impurity substances (particles) can be attached to a formed film, and craters can be formed in a formed film due to abnormal electrical discharge. If defective areas (i.e., particles and craters, etc.) of 10 μm or larger in diameter exist on the surface of the hard protective layer, interfacial debonding can occur originating in the defective areas during sliding operations. Therefore, it is necessary to control the film-forming process so that no defective areas of 10 μm or larger in diameter are formed.

In addition, in the hard protective layer in accordance with the present invention, which is a complex of an amorphous body and a crystalline body, an amorphous carbon body hardly forms particles, and a crystalline body has a microstructure either in the form of a microparticle or in a layer. It is easy to form a microstructure in the form of a layer when the amorphous body and the crystalline body are almost equal in volume. However, which microstructure is formed can be controlled with process parameters in film forming (e.g., moving rate of a substrate, vacuum degree, target electric power, and substrate bias voltage, etc.).

EXAMPLES

Preferred embodiments of the present invention are described hereinafter with reference to Examples. However, the present invention is not limited to Examples described below.

First, a test specimen was manufactured on which a hard protective layer with intentional craters of 10 μm or larger in diameter was formed using a non-equilibrium magnetron sputtering device. When the test specimen was subjected to a reciprocal sliding test using an engine oil containing no Mo-DTC (viscosity index: 5 W-30), interfacial debonding occurred originating in the craters, exposing the substrate in a major way. Based on this result, all the slide part specimens (Examples 1 to 24 and Comparative Examples 1 to 9, 11 to 16, 19, and 21) to be hereinafter described in Tables 1 to 3 were manufactured by the reactive sputtering method under the process conditions where craters of 10 μm or larger in diameter were not formed.

Preparation of Example 1

The method for manufacturing a slide part specimen in Example 1 is as follows. A steel substrate, a metal target, and a graphite target were set in a non-equilibrium magnetron sputtering device, and argon gas, hydrocarbon gas, and nitrogen gas were supplied to form a hard protective layer on the surface of the steel substrate by the reactive sputtering method.

More specifically, first, the first interlayer 21 composed of only metal was formed by supplying argon gas and applying electric power to the metal target. Next, the second interlayer 22 composed of metal and the metal carbide and the third interlayer 23 composed of the metal carbide and amorphous carbon were formed by supplying argon gas and hydrocarbon gas while continually varying the amount of electric power applied to the metal target and the graphite target. Finally, the hard protective layer was formed by supplying argon gas, hydrocarbon gas, and nitrogen gas and applying electric power to the metal target and the graphite target.

In Example 1, a target of titanium of a purity of 99.9% by mass (mass %) or over, a graphite target containing carbon of a purity of 99.9 mass % or over, argon gas of a purity of 99.999 mass % or over, nitrogen gas of a purity of 99.999 mass % or over, and methane gas of a purity of 99.999 mass % or over were used. Also, the hard protective layer was formed under the conditions where the ratio of the amount of electric power applied to a graphite target versus the amount of electric power applied to a titanium target was 100:3, and the gas flow rate of argon versus nitrogen versus methane was 100:40:5, and the film-forming time was controlled so that the thickness of the hard protective layer was 1.9 μm. A composition analysis of the manufactured hard protective layer by X-ray photoelectron spectroscopy showed that the atomic ratio of a metal element versus nitrogen versus carbon was 17:18:65.

Preparation of Examples 2 to 16, Comparative Examples 1 to 9, and 11 to 16

Specimens in Examples 2 to 16, Comparative Examples 1 to 9, and 11 to 16 were manufactured following a similar procedure to the one for Example 1. Hard protective layers different in composition and thickness were formed by using different metals for targets, and adjusting the amount of electric power applied to targets, the gas flow, and the film-forming time (see Tables 1 and 2 to be described later).

The specimens in Examples 2, 3, and 4 were prepared by changing the film thickness. The specimen in Example 5 was manufactured by decreasing the titanium concentration. While titanium was used for the metal target in Example 1, chromium (of a purity of 99.99 mass % or over) was used for the metal target in Example 6. The specimen in Example 7 was manufactured by decreasing the nitrogen concentration. The specimens in Examples 8, 9, and 10 were prepared by changing the chromium concentration. In Example 11, tungsten (of a purity of 99.999 mass % or over) was used for the metal target.

Furthermore, the specimen in Comparative Example 1 was manufactured by adding no metal element or nitrogen. The specimens in Comparative Examples 2 and 3 were manufactured by adding titanium, but no nitrogen. The specimens in Comparative Examples 4 and 5 were manufactured by adding chromium, but no nitrogen. The specimen in Comparative Example 6 was manufactured by adding tungsten, but no nitrogen. In Comparative Example 7, aluminum (of a purity of 99.999 mass % or over) was used for the metal target, and no nitrogen was added. In Comparative Example 8, the total of the metal element content and the nitrogen content were not within the preferred range in accordance with the present invention. The specimen in Comparative Example 9 was manufactured by adding a metal element in an amount larger than the preferred value in accordance with the present invention as an example of a hard protective layer with a decreased film hardness (1600 Hv).

Preparation of Comparative Examples 10, 17, and 18

In Comparative Examples 10, 17, and 18, a graphite target was set in an arc ion plating device to form a hard protective layer on the surface of a steel substrate. First, an arc discharge was developed by applying electric power with the graphite target as a cathode to form a single-layer amorphous coating. Next, the test specimen taken out of the arc ion plating device was lapped to remove droplets (carbon clusters generated from the target). Containing no hydrogen and argon, the hard protective layer obtained was a coating composed of only carbon (100 at. % carbon) with a film hardness of 8000 Hv.

[Observation and Measurement of Specimens]

Observations and analyses were conducted and measurements were taken for the specimens prepared in Examples 1 to 16 and Comparative Examples 1 to 18. Microstructures, chemical bond types, and composition were analyzed by transmission electron microscopy, X-ray diffractometry, and X-ray photoelectron spectroscopy. However, for a substance to be measured precisely by X-ray photoelectron spectroscopy, it needs to be contained in an amount more than 1 at. % due to energy resolution thereof. Therefore, the composition of specimens containing any element in an amount of 1 at. % or less were analyzed by wavelength-dispersive X-ray spectroscopy or X-ray fluorescence spectroscopy in combination with X-ray photoelectron spectroscopy. Also, the specimens were checked for hydrogen by Rutherford backscattering analysis with an elastic recoil detector. Moreover, the specimens were subjected to a reciprocal sliding test in an engine oil containing Mo-DTC or in an engine oil containing no Mo-DTC (viscosity index: 0 W-20 for both engine oils). The results are listed in Tables 1 and 2.

TABLE 1

|  |  | Example 1 | Example 2 | Example 3 | Example 4 | Example 5 | Example 6 | Example 7 | Example 8 |
|---|---|---|---|---|---|---|---|---|---|
| Manufacturing method | | Reactive sputtering | Reactive sputtering | Reactive sputtering | Reactive sputtering | Reactive sputtering | Reactive sputtering | Reactive sputtering | Reactive sputtering |
| Contained element other than carbon in hard protective layer[1] | | Ti, N, H, and Ar | Ti, N, H, and Ar | Ti, N, H, and Ar | Ti, N, H, and Ar | Ti, N, H, and Ar | Cr, N, H, and Ar | Cr, N, H, and Ar | Cr, N, H, and Ar |
| Composition[2]/at. % | Carbon | 65 | 87 | 89 | 87 | 87 | 59 | 67 | 70 |
| | Nitrogen | 18 | 8 | 9 | 10 | 12 | 3 | 0.1 | 2 |
| | Metal element | 17 | 3 | 2 | 3 | 0.5 | 38 | 33 | 28 |
| Compound crystal | Carbide | Existed | Not existed | Not existed | Not existed | Not existed | Existed | Existed | Existed |
| | Nitride and/or carbonitride | Existed | Existed | Existed | Existed | Existed | Existed | Existed | Existed |

TABLE 1-continued

| | | | Example 1 | Example 2 | Example 3 | Example 4 | Example 5 | Example 6 | Example 7 | Example 8 |
|---|---|---|---|---|---|---|---|---|---|---|
| Substitution of nitrogen in amorphous carbon body | | | Existed | Existed | Existed | Existed | Existed | Existed | Existed | Existed |
| Hardness of hard protective layer[3]/Hv | | | 2100 | 2500 | 2500 | 2400 | 2600 | 1800 | 2100 | 2300 |
| Thickness of hard protective layer/μm | | | 1.9 | 1.9 | 8.1 | 0.4 | 1.8 | 1.6 | 2.6 | 1.8 |
| Result of reciprocal sliding test | Wear resistance[4] | Interfacial debonding | A | A | A | A | A | A | A | A |
| | | Abrasion | A | A | A | A | A | A | A | A |
| | Friction coefficient[5] | | 0.045 | 0.045 | 0.045 | 0.044 | 0.045 | 0.053 | 0.044 | 0.039 |

| | | | Example 9 | Example 10 | Example 11 | Comparative Example 1 | Comparative Example 2 | Comparative Example 3 | Comparative Example 4 | Comparative Example 5 |
|---|---|---|---|---|---|---|---|---|---|---|
| Manufacturing method | | | Reactive sputtering | Reactive sputtering | Reactive sputtering | Reactive sputtering | Reactive sputtering | Reactive sputtering | Reactive sputtering | Reactive sputtering |
| Contained element other than carbon in hard protective layer[1] | | | Cr, N, H, and Ar | Cr, N, H, and Ar | W, N, H, and Ar | H and Ar | Ti, H, and Ar | Ti, H, and Ar | Cr, H, and Ar | Cr, H, and Ar |
| Composition[2]/at.% | Carbon | | 79 | 64 | 71 | 100 | 96 | 66 | 92 | 57 |
| | Nitrogen | | 16 | 35 | 14 | 0 | 0 | 0 | 0 | 0 |
| | Metal element | | 5 | 0.6 | 15 | 0 | 4 | 34 | 8 | 43 |
| Compound crystal | Carbide | | Not existed | Not existed | Existed | Not existed | Existed | Existed | Existed | Existed |
| | Nitride and/or carbonitride | | Existed | Existed | Existed | Not existed | Not existed | Not existed | Not existed | Not existed |
| Substitution of nitrogen in amorphous carbon body | | | Existed | Existed | Existed | Not existed | Not existed | Not existed | Not existed | Not existed |
| Hardness of hard protective layer[3]/Hv | | | 2500 | 2100 | 3100 | 3600 | 2800 | 2100 | 2800 | 2400 |
| Thickness of hard protective layer/μm | | | 1.7 | 2.0 | 2.5 | 1.8 | 1.7 | 1.7 | 1.8 | 1.8 |
| Result of reciprocal sliding test | Wear resistance[4] | Interfacial debonding | A | A | A | A | A | D | A | D |
| | | Abrasion | A | A | A | D | B | A | B | A |
| | Friction coefficient[5] | | 0.045 | 0.046 | 0.046 | 0.062 | 0.045 | 0.044 | 0.039 | 0.040 |

| | | | Comparative Example 6 | Comparative Example 7 | Comparative Example 8 | Comparative Example 9 | Comparative Example 10 |
|---|---|---|---|---|---|---|---|
| Manufacturing method | | | Reactive sputtering | Reactive sputtering | Reactive sputtering | Reactive sputtering | Arc ion plating |
| Contained element other than carbon in hard protective layer[1] | | | W, H, and Ar | Al, H, and Ar | Cr, N, H, and Ar | Cr, N, H, and Ar | Nothing |
| Composition[2]/at.% | Carbon | | 59 | 81 | 94 | 46 | 100 |
| | Nitrogen | | 0 | 0 | 2 | 18 | 0 |
| | Metal element | | 41 | 19 | 2 | 39 | 0 |
| Compound crystal | Carbide | | Existed | Not existed | Not existed | Not existed | Not existed |
| | Nitride and/or carbonitride | | Not existed | Not existed | Existed | Existed | Not existed |
| Substitution of nitrogen in amorphous carbon body | | | Not existed | Not existed | Existed | Existed | Not existed |
| Hardness of hard protective layer[3]/Hv | | | 3000 | 2200 | 3300 | 1600 | 8000 |
| Thickness of hard protective layer/μm | | | 2.0 | 1.9 | 2.2 | 1.8 | 1.0 |
| Result of reciprocal sliding test | Wear resistance[4] | Interfacial debonding | D | A | A | D | D |
| | | Abrasion | A | D | B | A | B |
| | Friction coefficient[5] | | 0.048 | 0.053 | 0.046 | 0.058 | 0.075 |

[1] Analyzed mainly by X-ray photoelectron spectroscopy;
[2] Entirety of carbon, nitrogen, and metal element being taken as 100 at. %;
[3] Conversion value from hardness $H_{IT}$ measured by instrumented indentation test for micro-area measurement, conversion formula of "Hv = 0.0926 × $H_{IT}$";
[4] Three estimations of "A: good wear resistant", "B: better wear resistant than Comparative Example 1 but insufficient", and "D: poor wear resistant"; and
[5] Friction coefficient at $6.0 \times 10^5$ times of reciprocation.

TABLE 2

|  |  | Example 12 | Example 13 | Example 14 | Example 15 | Example 16 | Comparative Example 11 | Comparative Example 12 |
|---|---|---|---|---|---|---|---|---|
| Manufacturing method | | Reactive sputtering | Reactive sputtering | Reactive sputtering | Reactive sputtering | Reactive sputtering | Reactive sputtering | Reactive sputtering |
| Contained element other than carbon in hard protective layer[1] | | Ti, N, H, and Ar | Ti, N, H, and Ar | Cr, N, H, and Ar | W, N, H, and Ar | Cr, N, H, and Ar | Ti, N, H, and Ar | Ti, N, H, and Ar |
| Composition[2]/at. % | Carbon | 87 | 85 | 70 | 71 | 95 | 87 | 85 |
|  | Nitrogen | 8 | 15 | 2 | 14 | 3 | 8 | 15 |
|  | Metal element | 3 | 0.05 | 28 | 15 | 2 | 3 | 0.05 |
| Compound crystal | Carbide | Not existed | Existed | Existed | Existed | Existed | Not existed | Existed |
|  | Nitride and/or carbonitride | Existed | Existed | Existed | Existed | Existed | Existed | Existed |
| Substitution of nitrogen in amorphous carbon body | | Existed | Existed | Existed | Existed | Existed | Existed | Existed |
| Hardness of hard protective layer[3]/Hv | | 2500 | 3200 | 2300 | 3100 | 3300 | 2500 | 3200 |
| Thickness of hard protective layer/μm | | 1.9 | 1.9 | 1.8 | 1.8 | 2.5 | 1.9 | 1.9 |
| Result of reciprocal sliding test | Mo-DTC in engine oil | Contained | Contained | Contained | Contained | Contained | Not contained | Not contained |
|  | Wear resistance[6] | A | A | A | A | A | A | A |
|  | Friction coefficient[5] | 0.045 | 0.047 | 0.039 | 0.046 | 0.042 | 0.095 | 0.110 |

|  |  | Comparative Example 13 | Comparative Example 14 | Comparative Example 15 | Comparative Example 16 | Comparative Example 17 | Comparative Example 18 |
|---|---|---|---|---|---|---|---|
| Manufacturing method | | Reactive sputtering | Reactive sputtering | Reactive sputtering | Reactive sputtering | Arc ion plating | Arc ion plating |
| Contained element other than carbon in hard protective layer[1] | | Cr, N, H, and Ar | W, N, H, and Ar | H and Ar | H and Ar | Nothing | Nothing |
| Composition[2]/at. % | Carbon | 70 | 71 | 100 | 100 | 100 | 100 |
|  | Nitrogen | 2 | 14 | 0 | 0 | 0 | 0 |
|  | Metal element | 28 | 15 | 0 | 0 | 0 | 0 |
| Compound crystal | Carbide | Existed | Existed | Not existed | Not existed | Not existed | Not existed |
|  | Nitride and/or carbonitride | Existed | Existed | Not existed | Not existed | Not existed | Not existed |
| Substitution of nitrogen in amorphous carbon body | | Existed | Existed | Not existed | Not existed | Not existed | Not existed |
| Hardness of hard protective layer[3]/Hv | | 2300 | 3100 | 3600 | 3600 | 8000 | 8000 |
| Thickness of hard protective layer/μm | | 1.8 | 1.8 | 1.8 | 1.8 | 1.0 | 1.0 |
| Result of reciprocal sliding test | Mo-DTC in engine oil | Not contained | Not contained | Contained | Not contained | Contained | Not contained |
|  | Wear resistance[6] | A | A | D | A | D | A |
|  | Friction coefficient[5] | 0.089 | 0.096 | 0.062 | 0.102 | 0.075 | 0.078 |

[1] Analyzed mainly by X-ray photoelectron spectroscopy;
[2] Entirety of carbon, nitrogen, and metal element being taken as 100 at. %;
[3] Conversion value from hardness $H_{IT}$ measured by instrumented indentation test for micro-area measurement, conversion formula of "Hv = 0.0926 × $H_{IT}$";
[5] Friction coefficient at $6.0 \times 10^5$ times of reciprocation; and
[6] Two estimations of "A: good wear resistant" and "D: poor wear resistant".

(Observation of Structure)

The coatings formed by the reactive sputtering method (Examples 1 to 16 and Comparative Examples 1 to 9, and 11 to 16) had smooth surfaces with no craters. In contrast, the coatings in Comparative Examples 10, 17, and 18, which were formed by the arc ion plating method, had craters of 1 μm or larger in diameter with a number density in the order of $10^6$ particles/mm² and craters of 10 μm or larger in diameter with a number density in the order of $10^3$ particles/mm² on their surfaces. These craters were believed to be the traces of droplets that were attached to the surfaces while the coatings were formed and then removed.

Figure 3:
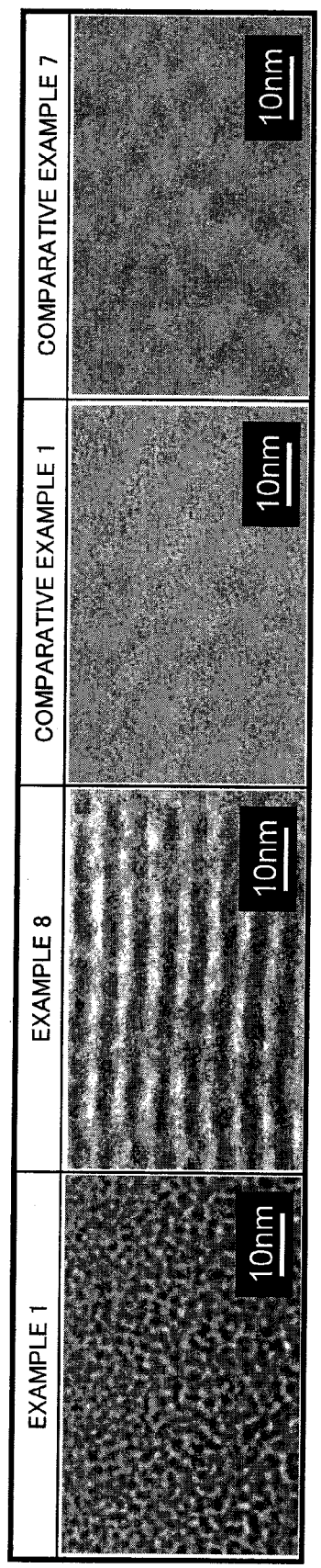
FIG. 3 is a bright-field image of a cross-section surface of a hard protective layer in accordance with Examples 1 and 8 and Comparative Examples 1 and 7 of the present invention observed by transmission electron microscopy.
Figure 4:
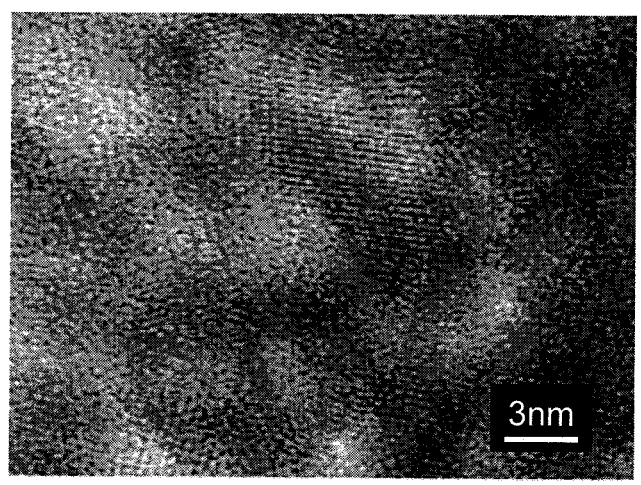
FIG. 4 is a high resolution image of a cross-section surface of the hard protective layer in accordance with Example 1 of the present invention.

FIG. 3 is a bright-field image of a cross-section surface of a hard protective layer in accordance with Examples 1 and 8 and Comparative Examples 1 and 7 of the present invention observed by transmission electron microscopy. FIG. 4 is a high resolution image of a cross-section surface of the hard protective layer in accordance with Example 1 of the present invention. The high resolution image in Example 1 (see FIG. 4) shows moire stripes typical of crystals in ambiguous contrast typical of amorphism. Since compound crystal particles in Example 1 measured by X-ray diffractometry were about 3 nm in diameter on average, it was demonstrated that the size of crystal particles observed by transmission electron microscopy and that of crystal particles measured by X-ray diffractometry were almost the same. The specimen in Example 1 had a microstructure in which compound crystal particles were dispersed with a number density in the order of $10^7$ particles/μm³, and the compound crystal had a volume percentage of about 35 vol. %. Also, the specimen in Example 8 had a microstructure in which 2.0 nm-thick layers of a compound crystal and 2.3 nm-thick layers of an amorphous body were alternately laminated, and the compound crystal had a volume percentage of 46.5 vol. %. On the other hand, in Comparative Example 1, where no metal element or nitrogen was added, and in Comparative Example 7, where aluminum was added, only a homogenous amorphous body was formed (observed).

Figure 5:
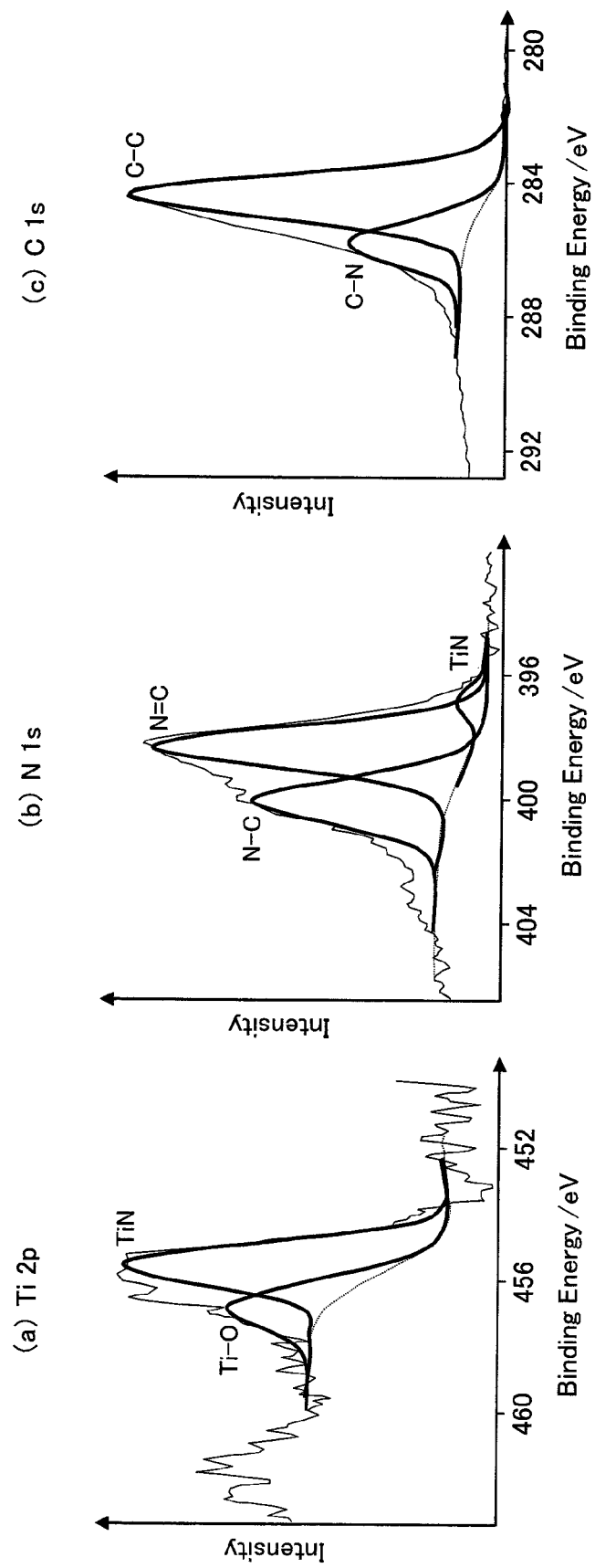
FIG. 5 shows an X-ray photoelectron spectrum in accordance with Example 5 of the present invention.

FIG. 5 shows an X-ray photoelectron spectrum in accordance with Example 5 of the present invention. The specimen in Example 5 contained only a small amount of a metal element (see Table 1). The type of bond between atoms was analyzed by X-ray photoelectron spectroscopy. As a result, only a metal nitride was detected as a compound crystal, and almost no metal carbide was detected. In other words, a metal nitride is more likely to be formed than a metal carbide in a hard protective layer formed by the manufacturing method in accordance with the present invention. In Examples 2 to 4, 9, and 10 and Comparative Example 8, where also only a small amount of a metal element was added, a metal nitride was detected, but no metal carbide was detected (see Table 1). Moreover, in the specimens containing a metal element in a larger amount in addition to nitrogen, a metal carbide and/or a metal carbonitride in addition to a metal nitride were detected.

On the other hand, in Comparative Examples 2 to 7, only a metal element and no nitrogen was added. Among them, in Comparative Examples 2 to 6, where either titanium, chromium, or tungsten was added, a metal carbide was detected. In contrast, in Comparative Example 7, where aluminum was added, aluminum did not form a carbide but formed a cluster structure between amorphous carbon atoms. Furthermore, in the specimens containing nitrogen, substitution of nitrogen was observed.

(Reciprocal Sliding Test)

Figure 6:
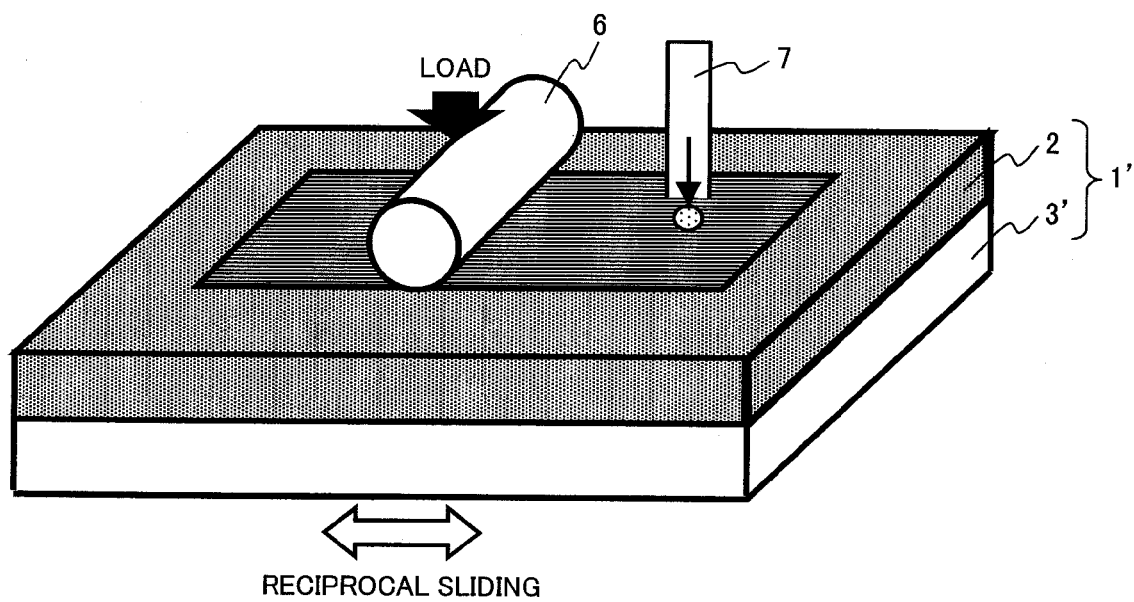
FIG. 6 is a schematic illustration showing a method for a reciprocal sliding test.

Reciprocal sliding tests were conducted in the following manner. FIG. 6 is a schematic illustration showing a method for a reciprocal sliding test. The hard protective layer 2 was formed on the surface of a steel strip substrate 3' with a surface roughness (Ra) of 0.02 μm (material: Cr—Mo alloy steel, size: 50 mm length×15 mm width×5 mm thickness) to manufacture a strip specimen 1'. In the reciprocal sliding test, the side of a cylindrical specimen 6 (material: cast iron, size: 4 mm diameter×11 mm length) was in line contact with the surface of the stripe specimen 1' with an engine oil containing Mo-DTC dripping on the contact surface at a rate of 1.0 ml/sec. from a metal tube 7. The strip specimen 1' was slid back and forth under the sliding conditions where the surface pressure was 822 MPa (load: 784 N), the sliding velocity was 0 to 1.6 m/sec., the sliding width was 30 mm, and the sliding onset temperature was 110° C. The strip specimen 1' was heated before the test to an initial temperature of 110° C. During sliding operations, the temperature of the strip specimen 1' increased to 150° C. due to friction heat. When no debonding spots of 0.1 mm or larger in size were found on the surface of the hard protective layer 2 in a sliding test where the number of reciprocation was $1.8\times10^6$, the strip specimen 1' was deemed to have sufficient durability (good wear resistant). In Comparative Examples 11 to 14, 16, and 18, an engine oil containing no Mo-DTC was used.

Figure 7:
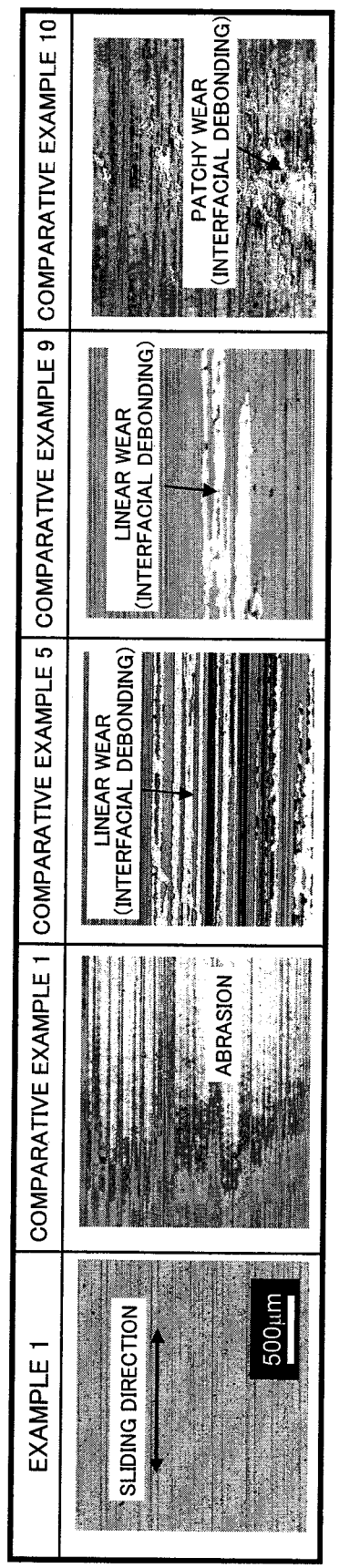
FIG. 7 is a surface observation image of a hard coating after a reciprocal sliding test in accordance with Example 1 and Comparative Examples 1, 5, 9, and 10 of the present invention.

FIG. 7 is a surface observation image of a hard coating after a reciprocal sliding test in accordance with Example 1 and Comparative Examples 1, 5, 9, and 10 of the present invention. As shown in FIG. 7, surface observation of the hard protective layer demonstrated that there were the following three types of wear in an engine oil containing Mo-DTC:

Abrasion, which causes the thickness of a layer to decrease (Comparative Example 1);

Linear wear, which causes the area of interfacial debonding to extend linearly in the sliding direction (Comparative Examples 5 and 9); and Patchy wear, which causes local interfacial debonding in a patchy manner (Comparative Example 10).

It was believed that abrasion occurred when chemical mechanical wear was not inhibited, linear wear occurred when the hardness and toughness of the hard protective layer were not sufficient, and patchy wear occurred when there were defective areas such as craters.

Figure 8:
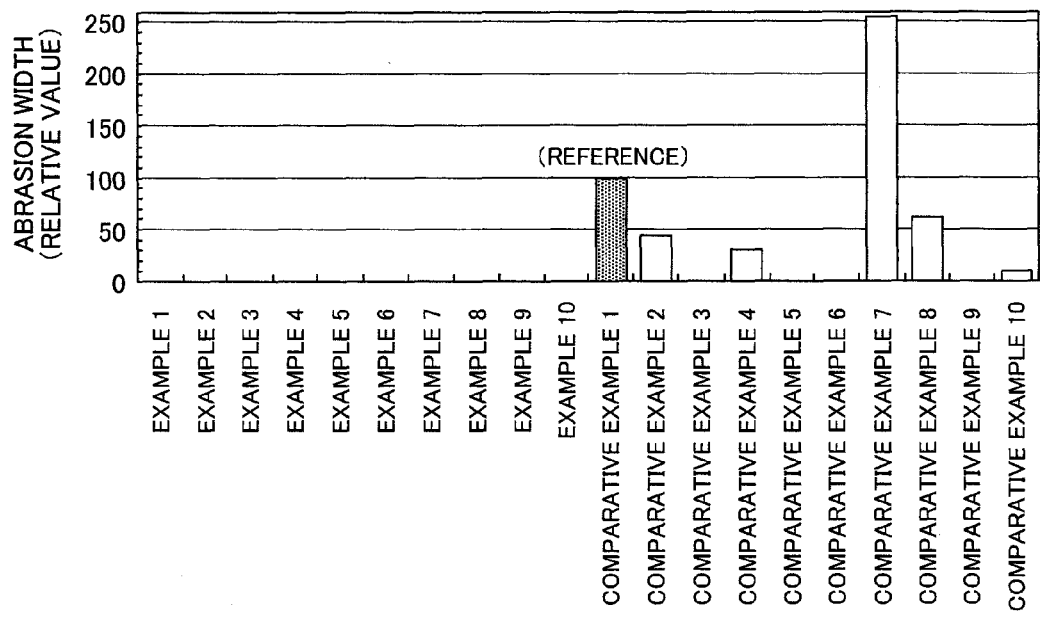
FIG. 8 is a comparison chart showing a length of an area of a substrate exposed due to abrasion (abrasion width) in a reciprocal sliding test.

FIG. 8 is a comparison chart showing a length of an area of a substrate exposed due to abrasion (abrasion width) in a reciprocal sliding test. When the result for Comparative Example 1 is taken as a reference value of 100, results for Examples and other Comparative Examples are shown in relative value. In Comparative Example 1, where an amorphous carbon coating containing no metal element or nitrogen manufactured by the reactive sputtering method was used, the surface of the substrate was exposed significantly due to abrasion. In contrast, the results for Comparative Examples 2 to 7, where only a metal element was added, showed that in Comparative Examples 2 and 4, although the abrasion widths were smaller, the abrasion inhibiting effect was insufficient. In Comparative Examples 3, 5, and 6, where the concentration of the metal element was high, although almost no surface exposure due to abrasion was observed, linear wear occurred.

Moreover, in Comparative Example 7, where aluminum was added, the abrasion width was large. Aluminum has a small free energy of oxide formation and therefore was expected to have a sacrificial oxidation reaction effect. However, aluminum turned out to have no sacrificial oxidation reaction effect on the chemical mechanical wear in an amorphous carbon coating clarified in the present invention.

Furthermore, in Comparative Example 8, where the total amount of the metal element and nitrogen added was not within the preferred range of the present invention, although the abrasion width was smaller than in Comparative Example 1, the abrasion inhibiting effect was insufficient. In Comparative Example 9, where the amount of the metal element added was larger than the preferred value of the present invention, although almost no surface exposure due to abrasion was observed, linear wear occurred.

In contrast, in Examples 1 to 10 in accordance with the present invention, excellent wear resistance was exhibited with the surface of the substrate not exposed (without abrasion or linear wear). Also, because the specimens in Examples 3 and 4 exhibited superior wear resistance, a coating thickness of 0.4 to 8 μm can be said to be preferred for application (see Table 1).

Meanwhile, in Comparative Example 10, where an amorphous carbon coating containing no hydrogen manufactured by the arc ion plating method was used, the specimen exhibited high hardness properties similar to those of diamond, and the abrasion width was about one tenth (1/10) of that in Comparative Example 1. However, since there were craters, which were the traces of removed droplets, on the surface of the specimen in Comparative Example 10, interfacial debonding occurred in a patchy manner originating in the craters (see FIG. 7).

Figure 9:
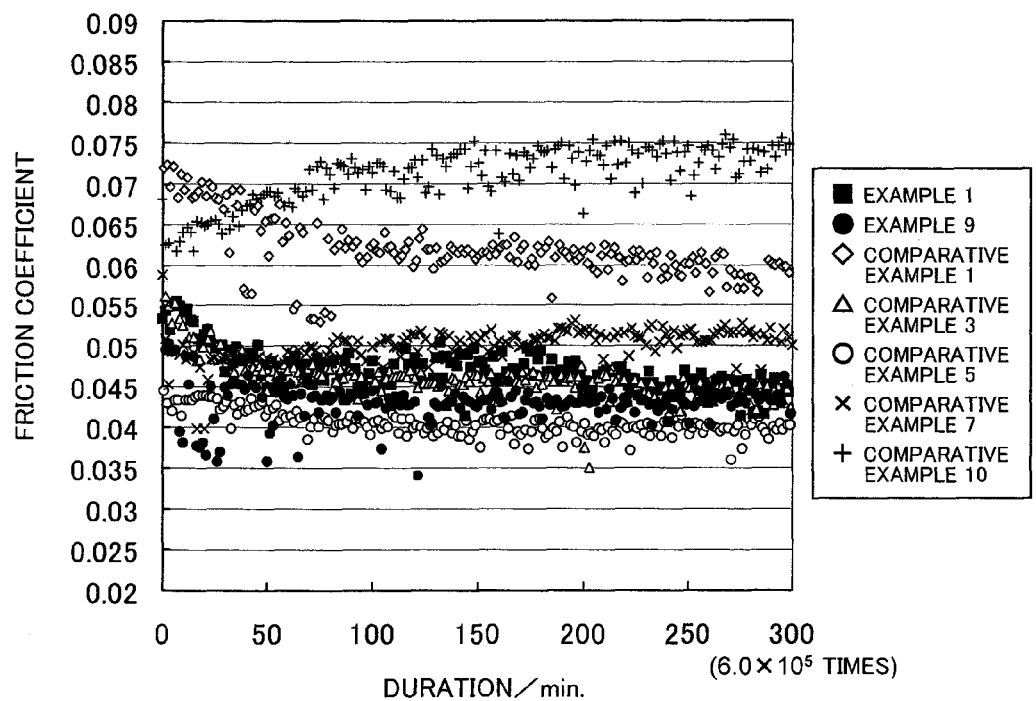
FIG. 9 is a graph showing a change in a friction coefficient of a hard coating during a reciprocal sliding test (the number of reciprocation: up to $6\times10^5$).

FIG. 9 is a graph showing a change in a friction coefficient of a hard coating during a reciprocal sliding test (the number of reciprocation: up to $6\times10^5$). An engine oil containing Mo-DTC (viscosity index: 0 W-20) was used as a lubricant. In Examples 1 and 9 and Comparative Examples 3, 5, and 7, where a metal element was added, the friction coefficients were lower than those in Comparative Examples 1 and 10, where no metal element was added, suggesting that the addition of a metal element is effective in reducing friction. In particular, in Example 7 and Comparative Example 4, chromium, which is homologous to molybdenum, was added, and the lowest friction coefficient was exhibited. Also, in Example 1 and Comparative Example 3, where titanium was added, a similar low friction coefficient was exhibited. It was believed that this was because these metal elements had an effect of activating the self-lubricating coating formation of molybdenum disulfide by adsorbing molybdenum compounds.

Reciprocal sliding tests were conducted for Examples 12 to 15 and Comparative Examples 11 to 18 in a similar manner. In these tests, an engine oil containing Mo-DTC and an engine oil containing no Mo-DTC were used for comparison. The results demonstrated that the hard protective layer in accordance with the present invention is highly effective in reducing friction and has superior friction resistance particularly in an engine oil containing Mo-DTC as shown in Table 2.

(Rockwell Indentation Test)

Figure 10:
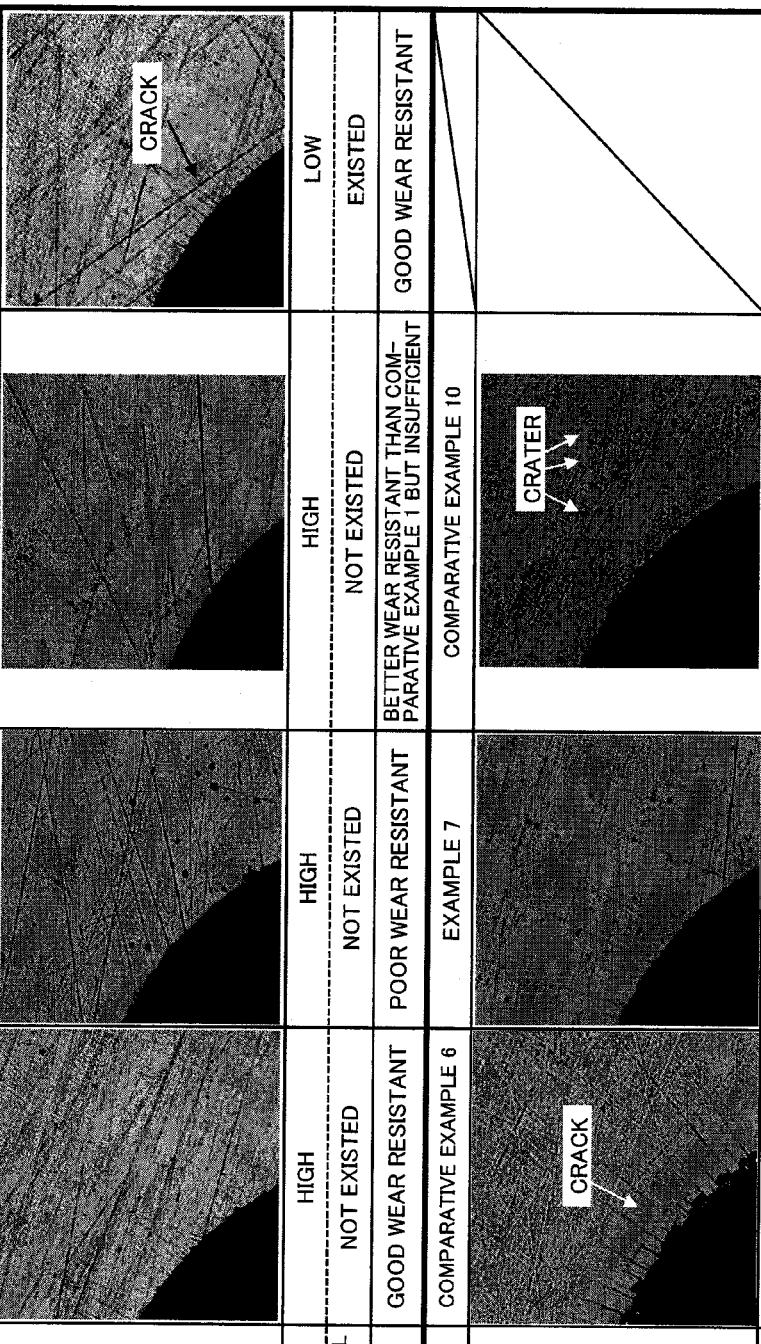
FIG. 10 is a surface observation image showing areas around Rockwell indentations when a Rockwell indenter is pressed against the surface of a hard coating of a strip specimen in accordance with Example 1 and Comparative Examples 1, 4 to 7, and 10.

FIG. 10 is a surface observation image showing areas around Rockwell indentations when a Rockwell indenter is pressed against the surface of a hard coating of a strip specimen in accordance with Example 1 and Comparative Examples 1, 4 to 7, and 10. Generally in a Rockwell indentation test, interfacial debonding is observed in areas around indentations on a coating with poor adhesion to its substrate. In Examples 1 to 11 and Comparative Examples 1 to 10, interfacial debonding attributed to poor adhesion was not observed. However, cracks, in which debonding originates, were observed around indentations in some specimens, which was attributed to low toughness.

As shown in FIG. 10, the hard coating in accordance with the present invention (Example 1), the hard coating containing no metal element or nitrogen (Comparative Example 1), and the hard coating containing aluminum which did not produce compound crystal particles (Comparative Example 7) were believed to have high toughness, since no cracks were observed on them. In contrast, obvious cracks were observed on the specimens with a hard coating containing only a metal element in a relatively large amount that produced metal carbide particles (Comparative Examples 5 and 6). Since a metal carbide is hard crystal, or brittle crystal, it was believed that a microstructure in which only a metal carbide is dispersed impaired the toughness of a hard coating. The results consistent with the results shown in FIGS. 7 and 8 (the abrasion width decreased but interfacial debonding (linear wear) occurred).

Meanwhile, the specimen in Comparative Example 10 had toughness high enough to prevent cracking around Rockwell indentations. However, many craters, which were believed to be the traces of removed droplets, were observed. The patchy wear that occurred in a reciprocal sliding test was attributed to interfacial debonding around these craters (see FIG. 7).

Preparation and Evaluation of Examples 17 to 24 and Comparative Examples 19 to 22

The specimens in Examples 17 to 24 and Comparative Examples 19 to 22 were prepared by forming a hard coating on the surface of an actual automobile part by a manufacturing method similar to the above. In Examples 17 to 20 and Comparative Examples 19 and 20, a hard coating was formed on the top surface of a valve lifter in a motoring engine simulating a direct-acting valve system. In Examples 21 to 24 and Comparative Examples 21 and 22, a hard coating was formed on the surface of each vane in a vane oil pump. Endurance tests were conducted in an actual equipment using an engine oil containing Mo-DTC (viscosity index: 0 W-20) as a lubricant to evaluate durability. The results are shown in Table 3.

TABLE 3

| | | Example 17 | Example 18 | Example 19 | Example 20 | Example 21 | Example 22 | Example 23 |
|---|---|---|---|---|---|---|---|---|
| Manufacturing method | | Reactive sputtering | Reactive sputtering | Reactive sputtering | Reactive sputtering | Reactive sputtering | Reactive sputtering | Reactive sputtering |
| Contained element other than carbon in hard protective layer[1)] | | Ti, N, H, and Ar | Ti, N, H, and Ar | Cr, N, H, and Ar | W, N, H, and Ar | Cr, N, H, and Ar | Ti, N, H, and Ar | Cr, N, H, and Ar |
| Composition[2)]/ at. % | Carbon | 65 | 87 | 59 | 71 | 65 | 85 | 59 |
| | Nitrogen | 18 | 8 | 3 | 14 | 18 | 15 | 3 |
| | Metal element | 17 | 3 | 38 | 15 | 17 | 0.05 | 38 |
| Hardness of hard protective layer[3)]/Hv | | 2100 | 2500 | 1800 | 3100 | 2100 | 3200 | 1800 |
| Thickness of hard protective layer/μm | | 1.9 | 1.9 | 1.8 | 1.7 | 1.9 | 1.9 | 1.8 |
| Result of endurance test using actual equipment | Automobile part | Valve lifter | Valve lifter | Valve lifter | Valve lifter | Vane | Vane | Vane |
| | Lubricant | Engine oil containing Mo-DTC (viscosity index: 0W-20) | | | | | | |
| | Wear resistance[7)] | A | A | A | A | A | A | C |

| | | Example 24 | Comparative Example 19 | Comparative Example 20 | Comparative Example 21 | Comparative Example 22 |
|---|---|---|---|---|---|---|
| Manufacturing method | | Reactive sputtering | Reactive sputtering | Arc ion plating | Reactive sputtering | Arc ion plating |
| Contained element other than carbon in hard protective layer[1)] | | Cr, N, H, and Ar | H and Ar | Nothing | H and Ar | Nothing |
| Composition[2)]/ at. % | Carbon | 64 | 100 | 100 | 100 | 100 |
| | Nitrogen | 35 | 0 | 0 | 0 | 0 |
| | Metal element | 0.6 | 0 | 0 | 0 | 0 |
| Hardness of hard protective layer[3)]/Hv | | 2100 | 3600 | 8000 | 3600 | 8000 |

TABLE 3-continued

|  |  |  |  |  |  |  |
|---|---|---|---|---|---|---|
| Thickness of hard protective layer/μm |  | 2.0 | 1.8 | 1.0 | 1.8 | 1.0 |
| Result of endurance test using actual equipment | Automobile part | Vane | Valve lifter | Valve lifter | Vane | Vane |
|  | Lubricant | Engine oil containing Mo-DTC (viscosity index: 0W-20) | | | | |
|  | Wear resistance[7] | A | D | D | D | D |

[1] Analyzed mainly by X-ray photoelectron spectroscopy;
[2] Entirety of carbon, nitrogen, and metal element being taken as 100 at. %;
[3] Conversion value from hardness $H_{IT}$ measured by instrumented indentation test for micro-area measurement, conversion formula of "Hv = 0.0926 × $H_{IT}$"; and
[7] Three estimations of "A: good wear resistant", "C: debonding due to cracking" and "D: poor wear resistant".

In the valve lifter endurance tests in an actual equipment on the specimens in Examples 17 to 20 and Comparative Examples 19 and 20, an acceleration test was conducted with a load almost double that during normal use, and after the test, wear damage of the hard coating was investigated. As a result, wear damage was observed in the coating in the whole area of the top surface of the valve lifter in Comparative Example 19, while significant wear damage was observed at the central area of the top surface, where the sliding velocity was maximized, in Comparative Example 20. In contrast, superior durability was demonstrated in Examples 17 to 20.

In the vane endurance tests in an actual equipment on the specimens in Examples 21 to 24 and Comparative Examples 21 and 22, an endurance test was conducted at a velocity corresponding to that during normal use, and after the test, wear damage of the hard coating was investigated. As a result, significant wear damage was observed in the coating at the tip section of each vane, which slides with a cam, and on the sides of each vane, which slides with the edge of a rotor, in Comparative Examples 21 and 22. In contrast, superior durability was demonstrated in Examples 21, 22, and 24.

However, microscopical debonding was observed on the surface of the specimen containing 38 at. % of chromium in Example 22. This was attributed to the fact that the surface pressure became extremely high locally, causing cracking originating at the interface between a compound crystal of the metal element and an amorphous body. This demonstrated that the preferred amount of a metal element contained in a hard coating for a slide part whose surface pressure becomes locally high (with the load imposed locally) is about half the preferred maximum value (e.g., 0.05 to 17 at. %, see Examples 21, 22, and 24).

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A slide part configured to be used in an environment where there is a lubricant containing molybdenum dialkyldithiocarbamate and/or molybdenum dithiophosphate, the slide part comprising a hard protective layer formed on an outermost surface of a substrate of the slide part, and a plurality of interlayers sandwiched between the hard protective layer and the substrate, wherein:
   the hard protective layer includes 59 at. % or more of carbon, and includes nitrogen, and a metal element;
   the hard protective layer is composed of a complex of an amorphous carbon body containing nitrogen and a compound crystal of the metal element;
   the compound crystal is composed of at least one of a metal carbide, a metal nitride, and a metal carbonitride;
   a surface hardness of the hard protective layer is 1800 or larger in Vickers hardness,
   the plurality of interlayers are composed of a first interlayer formed of the metal element immediately on the substrate, a second interlayer formed of the metal element and the metal carbide immediately on the first interlayer, and a third interlayer formed of the metal carbide and the amorphous carbon body immediately on the second interlayer, and
   a composition profile of at least the second interlayer continuously varies from an interface with the first interlayer to an interface with the third interlayer in a thickness direction.

2. The slide part according to claim 1, wherein:
   when an entirety of carbon, nitrogen, and the metal element is taken as 100 atomic percent (at. %), the hard protective layer contains 0.1 at. % or more to 35 at. % or less of nitrogen, and 0.05 at. % or more to 38 at. % or less of the metal element, while a combined amount of nitrogen and the metal element is 5 at. % or more.

3. The slide part according to claim 2, wherein:
   the hard protective layer further contains 25 at. % or less of hydrogen, 18 at. % or less of oxygen, and 5 at. % or less of argon.

4. The slide part according to claim 1, wherein:
   the metal element is at least one of chromium, titanium, and tungsten.

5. The slide part according to claim 1, wherein:
   the complex is composed of the compound crystal which is 0.1 nm or larger to 100 nm or smaller in particle size dispersed in a matrix of the amorphous carbon body;
   the hard protective layer contains 0.08 volume percent (vol. %) or more to 76 vol. % or less of the compound crystal; and
   a number density of the compound crystal is 1 particle/$10^6$ μm$^3$ or more to $10^{12}$ particles/μm$^3$ or less.

6. The slide part according to claim 1, wherein:
   the complex is composed of layers of the amorphous carbon body and layers of the compound crystal alternately laminated;
   the hard protective layer contains 30 vol. % or more to 76 vol. % or less of the compound crystal;
   the layers of the compound crystal are 1 nm or more to 50 nm or less in thickness; and
   the layers of the amorphous carbon body are 0.3 nm or more to 100 nm or less in thickness.

7. The slide part according to claim 1, wherein:
   the slide part is either a valve lifter, an adjusting shim, a cam, a camshaft, a rocker arm, a tappet, a piston, a piston pin, a piston ring, a timing gear, or a timing chain which are disposed in an internal combustion engine, or a drive gear, a driven gear, a rotor, a vane, or a cam which are disposed in an oil pump.

8. The slide part according to claim 1, wherein:
the lubricant is an engine oil.

9. The slide part according to claim 1, wherein:
the hard protective layer is formed by a reactive sputtering method using a non-equilibrium magnetron sputtering device;
a graphite target and a target containing at least one metal element selected from among chromium, titanium, and tungsten are used; and
hydrocarbon gas and nitrogen gas are used as a reactive gas.

10. The slide part according to claim 1, wherein:
a thickness of the hard protective layer is 0.5 to 8 μm.

11. A system comprising a slide part, a mating member and a lubricant oil, the slide part sliding on the mating member via the lubricant oil, the lubricant oil containing molybdenum dialkyldithiocarbamate and/or molybdenum dithiophosphate, the slide part comprising a hard protective layer formed on an outermost surface of a substrate of the slide part and contacting the lubricant oil, and a plurality of interlayers sandwiched between the hard protective layer and the substrate, wherein:
the hard protective layer includes 59 at. % or more of carbon, and includes nitrogen, and a metal element;
the hard protective layer is composed of a complex of an amorphous carbon body containing nitrogen and a compound crystal of the metal element;
the compound crystal is composed of at least one of a metal carbide, a metal nitride, and a metal carbonitride; and
a surface hardness of the hard protective layer is 1800 or larger in Vickers hardness,
the plurality of interlayers are composed of a first interlayer formed of the metal element immediately on the substrate, a second interlayer formed of the metal element and the metal carbide immediately on the first interlayer, and a third interlayer formed of the metal carbide and the amorphous carbon body immediately on the second interlayer, and
a composition profile of at least the second interlayer continuously varies from an interface with the first interlayer to an interface with the third interlayer in a thickness direction.

12. The system according to claim 11, wherein:
when an entirety of carbon, nitrogen, and the metal element is taken as 100 atomic percent (at. %), the hard protective layer contains 0.1 at. % or more to 35 at. % or less of nitrogen, and 0.05 at. % or more to 38 at. % or less of the metal element, while a combined amount of nitrogen and the metal element is 5 at. % or more.

13. The system according to claim 11, wherein:
the hard protective layer further contains 25 at. % or less of hydrogen, 18 at. % or less of oxygen, and 5 at. % or less of argon.

14. The system according to claim 11, wherein:
the metal element is at least one of chromium, titanium, and tungsten.

15. The system according to claim 11, wherein:
the complex is composed of the compound crystal which is 0.1 nm or larger to 100 nm or smaller in particle size dispersed in a matrix of the amorphous carbon body;
the hard protective layer contains 0.08 volume percent (vol. %) or more to 76 vol. % or less of the compound crystal; and
a number density of the compound crystal is 1 particle/$10^6$ μm$^3$ or more to $10^{12}$ particles/μm$^3$ or less.

16. The system according to claim 11, wherein:
the complex is composed of layers of the amorphous carbon body and layers of the compound crystal alternately laminated;
the hard protective layer contains 30 vol. % or more to 76 vol. % or less of the compound crystal;
the layers of the compound crystal are 1 nm or more to 50 nm or less in thickness; and
the layers of the amorphous carbon body are 0.3 nm or more to 100 nm or less in thickness.

17. The system according to claim 11, wherein:
the slide part is either a valve lifter, an adjusting shim, a cam, a camshaft, a rocker arm, a tappet, a piston, a piston pin, a piston ring, a timing gear, or a timing chain which are disposed in an internal combustion engine, or a drive gear, a driven gear, a rotor, a vane, or a cam which are disposed in an oil pump.

18. The system according to claim 11, wherein:
a thickness of the hard protective layer is 0.5 to 8 μm.

19. The system according to claim 11, wherein:
composition profiles of the second and the third interlayers continuously vary from an interface with the first interlayer to an interface with the hard protective layer in a thickness direction.

20. The slide part according to claim 1, wherein:
composition profiles of the second and the third interlayers continuously vary from an interface with the first interlayer to an interface with the hard protective layer in a thickness direction.

* * * * *